United States Patent [19]

Doemens

[11] Patent Number: 4,705,329
[45] Date of Patent: Nov. 10, 1987

[54] APPARATUS FOR ELECTRICAL FUNCTION CHECKING OF WIRING MATRICES

[75] Inventor: Günter Doemens, Holzkirchen, Fed. Rep. of Germany

[73] Assignee: Siemens Aktiengesellschaft, Berlin and Munich, Fed. Rep. of Germany

[21] Appl. No.: 902,744

[22] Filed: Sep. 2, 1986

[30] Foreign Application Priority Data

Sep. 4, 1985 [DE] Fed. Rep. of Germany ....... 3531594

[51] Int. Cl.$^4$ .......................................... G01R 31/02
[52] U.S. Cl. ................................ 324/73 PC; 324/500
[58] Field of Search ................ 324/51, 52, 54, 62, 324/64, 96, 158 P, 158 F, 73 PC

[56] References Cited

U.S. PATENT DOCUMENTS 4,507,605 3/1985 Geisel ........................... 324/73 PC
4,600,878 7/1986 Doemens et al. ................. 324/51

FOREIGN PATENT DOCUMENTS 0102565 3/1984 European Pat. Off. .

OTHER PUBLICATIONS

H. Bohlen et al., "Tester for Electric Conductors", vol. 14, #5, IBM Technical Disclosure Bulletin (Oct. 1971), p. 1601.

H. J. Meixner, "Federnde Prüfspitzen-wichtiges Zubehör in . . . ", Elektronik Produktion & Prüftechnik (Nov. 1979), pp. 472–473.

Primary Examiner—Reinhard J. Eisenzopf
Assistant Examiner—Stephen M. Baker
Attorney, Agent, or Firm—Hill, Van Santen, Steadman & Simpson

[57] ABSTRACT

An apparatus for function checking of wiring matrices includes a carrier plate with a plurality of gas discharge channels formed therein. At least one selected measuring locations on a wiring matrix are ionically contacted through selected ones of the gas discharge channels, the gas discharge channels being selected by an electrode bus bar allocated to an electrode in the gas discharge channel and by controllably charging the gas discharge channels with an ionizing radiation to initiate the gas discharges. The ionizing radiation is controlled by either beam deflection or by masks.

10 Claims, 5 Drawing Figures

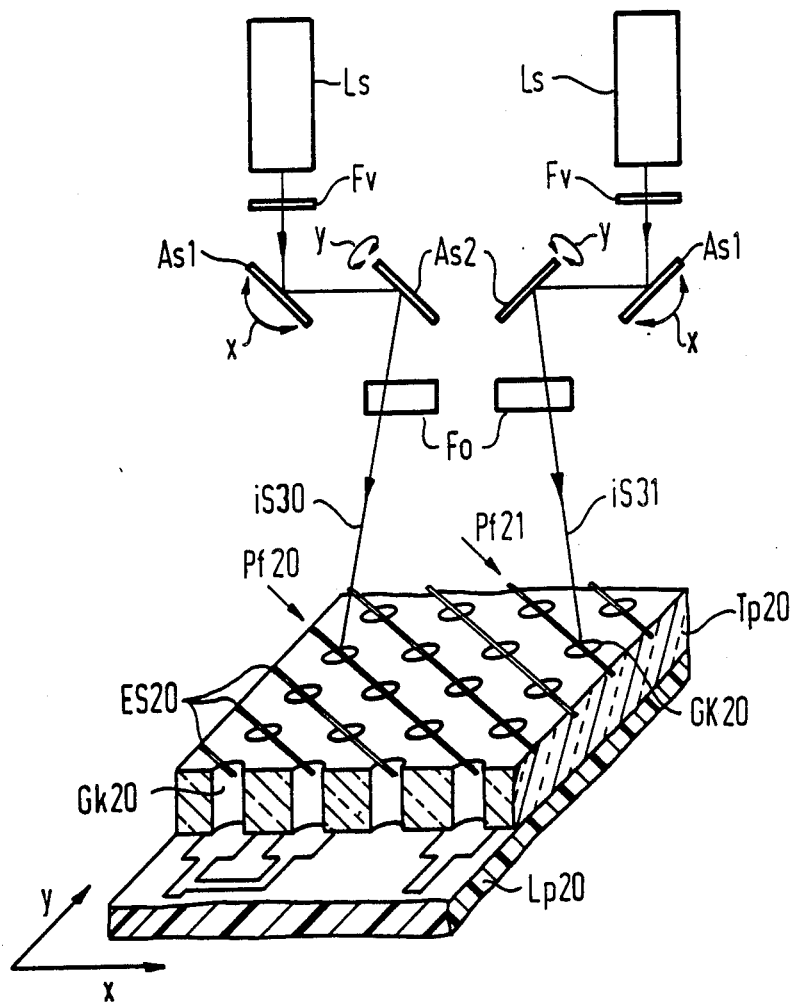

4,705,329

APPARATUS FOR ELECTRICAL FUNCTION CHECKING OF WIRING MATRICES

CROSS-REFERENCE TO RELATED APPLICATION

Cross-reference is made to a related copending patent application entitled "DEVICE FOR ELECTRICALLY CHECKING PRINTED CIRCUIT BOARDS", Ser. No. 902,925 filed simultaneously herewith.

BACKGROUND OF THE INVENTION

1. Field of the Invention

The present invention relates to an apparatus for electrical function checking of wiring matrices in which gas discharges in gas discharge channels provide ionic contacting.

2. Description of the Prior Art

In automatic testing units and test adaptors for unequipped and equipped printed circuit boards, as well as for wiring matrices which are prepared by soldering or crimping, the contacting of selected measuring locations thereon is usually undertaken using resilient test probes. The resilient test probes are arranged in a grid having the dimensions of the wiring matrix to be tested and are secured by resilient sleeves which are pressed into a carrier platen and into which the test probes are pushed. The dimensions of the test probes are selected to have the smallest spacing of the measuring locations relative to one another, as well as having sufficient diameter to carry the current load required. In the publication Elektronik Produktion und Pruftechnik, November 1979, pp. 472 and 483, 0.69 mm is generally cited as a lower limit for the diameter of such probes.

For the known function checking apparatus for circuit boards, tests on conductivity and insulation measurements are performed between test locations formed by grid points in accordance with the layout of the circuit board. Since the resilient test probes for contacting the test locations must be arranged in the grid of the printed circuit, the realization of such test apparatus becomes increasingly difficult as the grid dimensions decrease and the areas of the printed circuit boards increase. Thus, an arrangement of resilient test probes in grid dimensions of below 1 mm can generally not be precisely engineered to give a reliable mechanical contacting with the test locations. With the increasing number of test locations, which can, for example, amount to over 100,000 test locations, the number of leads and switch elements required also increases. This causes a considerable apparatus oriented outlay and correspondingly higher costs. Moreover, the probability of completely contacting the printed circuit boards considerably decreases for the increased number of measuring locations.

European Pat. No. A-0 102 565 discloses an apparatus for electrical function checking of wiring matrices wherein standard ohmic contacts are replaced by non-touching ionic contacts through gas discharge paths. A plurality of gas discharge channels are provided with electrodes and extend into a carrier plate for placement over the wiring matrix. The gas discharge channels are arranged in a framework similar to the wiring matrix and are open toward the measuring locations on the matrix. When two selected measuring locations are connected to one another in an electrically conductive fashion, such as by an interconnect, the corresponding gas discharge channels form two series connected gas discharge paths which can be triggered by applying an adequately high voltage to the respective electrodes. A current flow then ensues upon the ignition of the gas discharges and can be measured for test purposes. When the ignition of the gas discharge does not occur, or when the current flow is lower than is expected after ignition, then conclusions can be drawn regarding an interrupted connection between the selected measuring locations, including that an electrically conductive connection did not exist at all.

When an AC voltage is superimposed over the voltage supplied to the electrodes, then the phase of the resulting current change is compared to the phase of the AC voltage to identify the impedance of the connection between the selected measuring locations.

Thus, the known devices enable conductivity and insulation measurements to be performed with extremely high reliability by avoiding ohmic contacts. Using such ionic contacting of the measuring locations through gas discharge channels, extremely small dimensions can be realized. Wiring matrices having grid dimensions of the measuring locations of down to 0.1 mm can be tested reliably using such devices. Given the high number of test locations for a wiring matrix to be tested, however, problems continue to occur. Such problems arise as a result of the numerous leads and test elements required for connection of the electrodes in the gas discharge channels.

Use of laser beams for labelling is disclosed in Laser 79 Opto-Electronics, Vol. 2 through 6, July 1979, pp. 235–239.

SUMMARY OF THE PRESENT INVENTION

An object of the present invention is to dramatically reduce the number of leads required for an ionic contacting, wiring matrix checking device having gas discharge channels. This and other objects are inventively achieved in the present device by controllably charging the gas discharge channels with a radiation to induce gas discharges therein in conjunction with the electrodes in the gas discharge channels.

In the present invention, the connection of electrodes in the plurality of gas discharge channels is undertaken through common electrode bus bars. To initiate a gas discharge in the gas discharge channels corresponding to the selected measuring locations, the gas discharge channels are charged with a corresponding radiation as an additional condition. In the electrical function checking of wiring matrices through the present device, the following conditions must be met for the ignition of a gas discharge:

(a) a connection which is adequately electrically conductive must be present between the selected measuring locations of the wiring matrix.

(b) a voltage having a chronological curve and amplitude insufficient to trigger a gas discharge by itself is applied to the electrodes of the gas discharge channels corresponding to the selected measuring locations through corresponding electrode bus bars.

(c) the gas discharge channels corresponding to the selected measuring locations are selectively charged with a radiation by means of which the requisite ignition voltage is lowered to ignite a gas discharge, or by means of which the ignition delay is shortened such that an ignition occurs during a brief application of the ignition voltage.

Precondition (a) relates to a property of the wiring matrix to be tested, whereas preconditions (b) and (c) are crucial for unequivocal addressing of the selected measuring locations of a wiring matrix. When an ignited gas discharge has a corresponding current strength, then conclusions can be drawn regarding the presence of an adequately electrically conductive connection between the addressed measuring locations. When no ignition occurs, the connection is lacking or has been interrupted.

Using the addressing of the present invention for selecting the measuring locations and the corresponding gas discharge channels allocated to those locations, the number of leads required is considerably reduced. This is particularly true since a plurality of the gas discharge channels can be allocated to each electrode bus bar. In addition to a considerable reduction in wiring outlay, technically realizing the apparatus for function checking large printed circuit board formats having small grid dimensions is particularly significantly facilitated. A significant reduction in manufacturing costs is also realized. The additional outlay required for addressing the gas discharge channels with a charging radiation to initiate gas discharges is considered slight in comparison to the other cost savings.

During use of the present electrical function checking apparatus, the measuring locations are perfectly ionically contacted. In other words, the second electrode of the gas discharge path is formed directly by the measuring location on the printed circuit board. A very high reliability is achieved by avoiding ohmic contacts.

Alternately, an advantage of the present invention for addressing measuring locations and their respective gas discharge channels can be realized in a significant reduction of wiring outlay even when ohmic contacts of the measuring locations are undertaken by the use of resilient test probes. Such probes are arranged at the lower end of the gas discharge channels. The resilient test probes then form the second electrode of the gas discharge paths and are ionically contacted at the side lying opposite the probe end. Such probes can be formed with a smaller diameter than the traditional test probes which are connected to wiring. The small grid dimensions which are possible using purely ionic contacting at the measuring locations, however, cannot be achieved through the use of such test probes.

In accordance with a preferred development of the present invention, the electrodes of the gas discharge channels are connected together in rows. Such a row-by-row combination of the electrode terminals is well adapted to the regular grid arrangement of the measuring locations as is usually present on circuit boards. Laying out the bus bars then becomes particularly clear and simple.

If the electrode bus bars are arranged at right angles relative to the principal direction of the wiring for the wiring matrix to be tested, then a further advantage can be realized. As a result of this angular relationship, the same electrode bus bar is not allocated to two selected measuring locations. When, for example, the electrode bus bars proceed at an angle of 45° relative to the principal direction of the wiring, then all measuring locations can be covered by turning the overall carrier plate by an angle of 90° or 270° with respect to the wiring.

A further simplification in the manufacturing of the present device is when electrodes are formed by sections of the electrode bus bars that cross the gas discharge channels. Techniques that are used in the manufacture of printed circuit boards and film circuits can be used to manufacture such electrodes and electrode bus bars.

The charging of the selected gas discharge channels with radiation to initiate the gas discharges is controlled by deflecting rays over the gas discharge channels. Techniques which are used in labelling parts with detectable laser beams can be used for such deflection.

It is also possible to control the charging of the selected gas discharge channels with a mask which has radiation transmissive regions corresponding to the selected gas discharge channels through which passes the ionizing radiation. When a mask is formed by a liquid crystal cell having transparent electrodes, then the radiation charging of the selected gas discharge channels is undertaken in a particularly simple way by driving the corresponding transparent electrodes. To further simplify the present invention, the connections of the transparent electrodes are preferably driven by a plurality of bus bars. An even further simplification of the connection and drive of the transparent electrodes occurs when the transparent electrodes are connected to one another by bus bars in rows. The bus bars proceed obliquely to the electrode bus bars so that matrix addressing of the gas discharge channels for the selected measuring locations is possible.

BRIEF DESCRIPTION OF THE DRAWINGS

FIG. 4 shows an embodiment of a device of the present invention using the carrier plate shown in FIG. 3 in combination with a controllable charging apparatus for deflecting laser beams.

DESCRIPTION OF THE PREFERRED EMBODIMENTS

Figure 1:
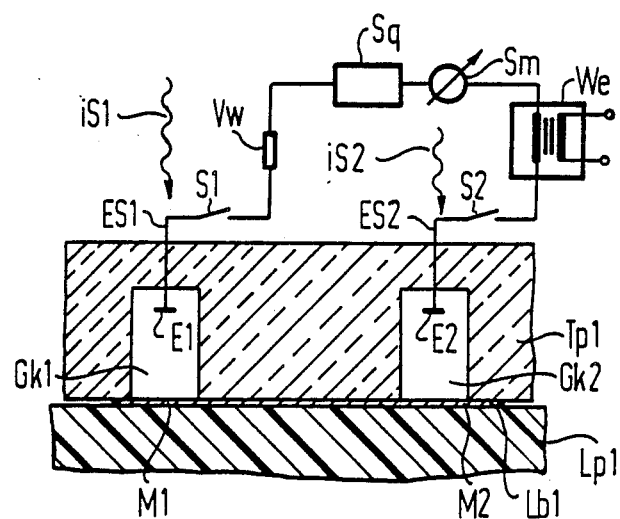
FIG. 1 is a schematic diagram of an apparatus according to the principles of the present invention for electrical function checking of printed circuit boards.

Referring first to FIG. 1, a greatly simplified schematic illustration is shown of an apparatus for electrical function checking of printed circuit boards by non-touching ionic contacting of the measuring locations through gas discharge paths. A portion of a printed circuit board Lp1 has an interconnect Lb1 at an upper side thereof, the ends of which form measuring locations M1 and M2, respectively. A carrier plate Tp1 formed of insulating material is in place at the upper side of the printed circuit board Lp1. The insulating material of the carrier plate may, for example, be glass. A plurality of gas discharge channels formed in the carrier plate Tp1 are in the form of blind holes. Gas discharge channel Gk1, corresponding to the measuring location M1, and gas discharge channel Gk2, corresponding to the measuring location M2, are shown. An electrode E1 which is connected to an electrode bus bar ES1 is disposed within the gas discharge channel Gk1 at a portion opposite the measuring location M1. Correspondingly, an electrode E2 connected to an electrode bus bar ES2 is disposed within the gas discharge channel Gk2. The electrodes E1 and E2 are connected by the electrode bus bars ES1 and ES2 to a plurality of other gas discharge channels (not shown) in rows.

The two measuring locations M1 and M2 are selected for function checking when the electrodes E1 and E2 of the corresponding gas discharge channels Gk1 and Gk2 are driven. As shown schematically in FIG. 1, the electrodes E1 and E2 are driven through the electrode bus bars ES1 and ES2 by switches S1 and S2, respectively. A drop resistor Vw, a voltage source Sq, a current measuring means Sm, and an alternating voltage generator We is connected in series between the switches S1 and S2.

The overall arrangement shown in FIG. 1 is disposed within an evacuatable space under a reduced pressure of, for example, 10 Torr. The evacuatable space is preferably filled with a gas, such as nitrogen. The gas discharge paths Gk1 and Gk2 are connected in series through the interconnect Lb1 by a gas discharge between the electrode E1 and the measuring location M1, as well as by a gas discharge occurring between the electrode E2 and the measuring location M2.

The voltage source Sq has a voltage twice that of the maintaining voltage which is applied to the two series connected gas discharge paths through the switches S1 and S2. The amplitude of the maintaining voltage is not allowed to reach twice that of the ignition voltage under any conditions. An ignition voltage for the gas discharge paths is only initiated when the gas discharge channels Gk1 and Gk2 corresponding to the selected measuring locations M1 and M2 are additionally charged with an ionizing radiation, shown as iS1 and iS2. The ionizing radiation iS1 and iS2 can either be a short-wave electromagnetic radiation or a particle radiation which reduces the ignition voltage of the gas discharge channels Gk1 and Gk2. The necessary ignition voltage for the gas discharge channels Gk1 and Gk2 is reduced sufficiently by the radiation iS1 and iS2, respectively, so that the voltage adjacent the switches S1 and S2 is adequate for igniting the gas discharge paths. Ignition of the gas discharges is only possible when the gas discharge channels are selected by their corresponding electrode bus bars and are simultaneously selectively charged with a radiation in the form of an ionizing radiation. Reliable addressing of the selected gas discharge channels and their corresponding measuring locations is, thus, guaranteed.

When the gas discharges ignite in the gas discharge channels Gk1 and Gk2, the charging of the gas discharge channels Gk1 and Gk2 with the ionizing radiation iS1 and iS2, respectively, can be discontinued. A current measuring means Ms (not shown) which is inserted into the circuit registers the currents of the two gas discharges so that conclusions can be drawn as to the presence of an adequate electrical connection between the two measuring locations M1 and M2, such as whether the test locations are connected electrically or whether the interconnect Lb1 is interrupted. Impedance between the measuring locations M1 and M2 can also be measured by superimposing an AC voltage over the existing voltage by the use of an AC generator We. Such superimposition of an AC voltage can be undertaken by inductive coupling, such as shown in FIG. 1. The measurement of resistance is undertaken at the differential cusp points of the gas discharge characteristic since the internal resistances of the gas discharge paths are practically bridged for AC voltage. Small fluctuations $\Delta U$ in the superimposed AC voltage result in relatively great fluctuations $\Delta I$ in the current. A phase-sensitive current measuring means Sm is arranged in the circuit to register the current fluctuations. The current measuring means Sm can be in the form of a commercially available lock-in amplifier. The resistance R can be identified from the relationship $R = \Delta I/\Delta U$. When the interconnect Lb1 is only partially interrupted, this can be determined by the amplitude of the identified resistance. Moreover, the resistance can be identified to measure insulating properties.

Figure 2:
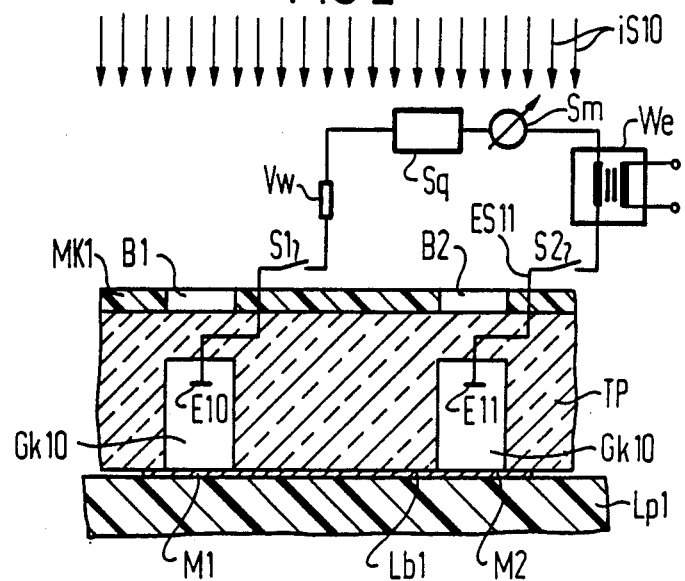
FIG. 2 is a schematic diagram of another embodiment of the device of the present invention.

In FIG. 2, a modification of the present device is shown in which a carrier plate Tp10 has gas discharge channels Gk10 and Gk11 corresponding to the measuring locations M1 and M2. The electrodes E10 and E11 of the gas discharge channels Gk10 and Gk11, respectively, are driven as set forth above with respect to FIG. 1 through the switches S1 and S2 and corresponding electrode bus bars ES10 and ES11. An ionizing radiation iS10 for charging the selected gas discharge channels Gk10 and Gk11 is distributed over the entire surface of the carrier plate Tp10. However, the ionizing radiation iS10 is controlled by a mask Mk1 which is placed over the carrier plate Tp10. The mask Mk1 permits the ionizing radiation iS10 to pass only through regions B1 and B2 which correspond to the selected gas discharge channels Gk10 and Gk11. It is evident that the designational charging of the selected gas discharge channels can be controlled by positioning the radiation transmissive regions of the mask or by the use of a plurality of masks.

Figure 3:
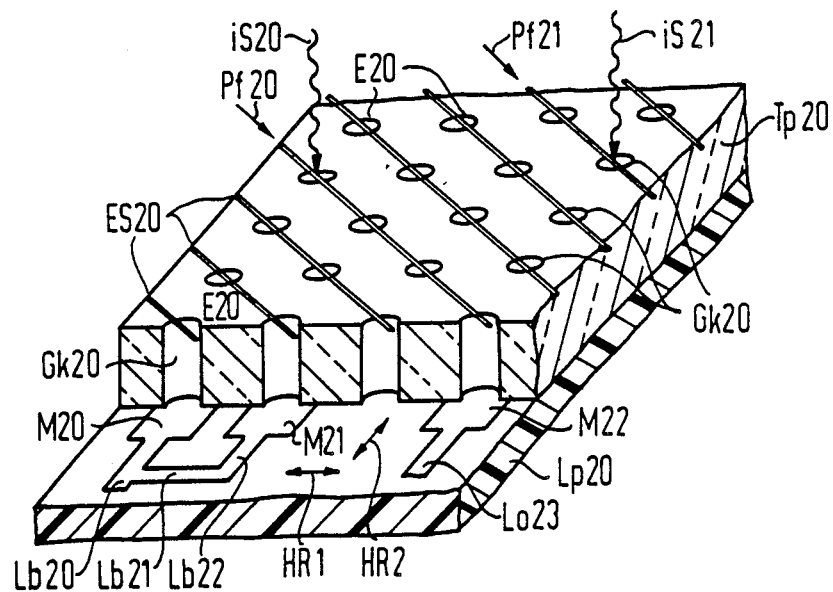
FIG. 3 is a perspective view of a carrier plate having gas discharge channels as used in the devices of FIGS. 1 and 2.

Referring now to FIG. 3, a printed circuit board Lp20 on whose surface measuring locations M20, M21 and M22 are arranged in a grid dimension is shown. The measuring locations M20-M22 are connected by interconnects Lb20, Lb21, Lb22 and Lb23. The principal directions of the interconnects Lb20-Lb23 are perpendicular to one another and are indicated as HR1 and HR2. A carrier plate Tp20 is in place on the other side of the printed circuit board Lp20 and includes a plurality of cylindrical gas discharge channels Gk20 which are introduced into the carrier plate Tp20. The carrier plate Tp20 is formed of photolithographically structurable form glass in which the gas discharge channels Gk20 are introduced by standard masking and etching techniques.

Straight-line grooves are formed on the surface of the carrier plate Tp20 and electrode bus bars ES20 are disposed along the grooves. Electrodes E20 are formed directly by sections of the electrode bus bars ES20 at the crossing regions for the gas discharge channels Gk20. The electrode bus bars ES20 and their appertaining electrodes E20 can be manufactured by techniques which are standard in the field of printed circuit boards and film circuits. Precious metals such as, for example, gold are particularly suitable materials for the electrode bus bars ES20.

The position of the gas discharge channels Gk20 corresponds exactly to the grid of the measuring locations M20-M22 for the printed circuit board Lp20. The measuring locations M20-M22 can be seen lying immediately below the gas discharge channels Gk20. It is also apparent from FIG. 3 that the number of gas discharge channels Gk20 arranged in rows and columns is greater than the number of measuring locations on the printed circuit board Lp20.

The electrode bus bars ES20 proceed at an angle of 45° relative to the principal directions HR1 and HR2 of the interconnects on the printed circuit board Lp20. The reason for selecting the angle of 45° for the electrode bus bars ES20 becomes apparent during the following explanation of the addressing of selected measuring locations. When two measuring locations are selected for electrical function checking of the printed circuit board Lp20. The gas discharge channels allocated to the selected measuring locations must be specified by appropriate addressing. Thus, for example, the two gas discharge channels Gk20, identified with an asterisk (*), are electrically driven by the corresponding electrode bus bars ES20 as indicated by the arrows PF20 and PF21. To exactly discriminate the selected gas discharge channels Gk20 from other gas discharge channels Gk20, the selected gas discharge channels, indicated with an asterisk, are charged with an ionizing radiation iS20 and iS21. Only when the charging of the ionizing radiation iS20 and iS21 is present as a precondition can the ignition of the gas discharge be created. When the gas discharges in fact are ignited, conclusions can be drawn as to the presence of an electrically conductive connection between the selected measuring locations. Conductivity and insulation measurements can be undertaken as set forth in conjunction with FIG. 1.

Addressing of the selected gas discharge channels Gk20 only fails when the selected measuring locations have the same electrode bus bar ES20 allocated thereto. In such instance, the measuring locations can be covered by using a second carrier plate having a different arrangement of electrode bus bars or by using the same carrier plate Tp20 and by rotating the carrier plate by an angle of 90° or 270°.

In FIG. 4, an arrangement is shown similar to that of FIG. 3 including means for controllably charging the gas discharge channels Gk20 with an ionizing radiation. The charging of the selected gas discharge channels Gk20 is undertaken with the assistance of deflectable laser beams, where deflection of the laser beams is in a planar x-y coordinate system. Two UV lasers Ls are shown, along with a photographic shutter FV, a first deflecting mirror AS1 for deflecting the lasers in an x-direction, and a second deflecting mirror AS2 for deflecting the lasers in a y-direction. Focusing optics Fo are also arranged in the path of the laser beams. It can be seen that the ionizing radiation iS30 and iS31 in the form of the focused laser beams can be steered into the selected gas discharge channels Gk20 from above; the deflection of the laser beam being guided by the mirrors As1 and As2.

The carrier plate Tp20 is covered by a cover plate (not shown) which is transmissive for the ionizing radiation iS30 and iS31. The cover plate may be composed of, for example, glass. Deflection of the ionizing radiation iS30 and iS31 can be controlled through the use of computers or micro-computers.

Figure 5:
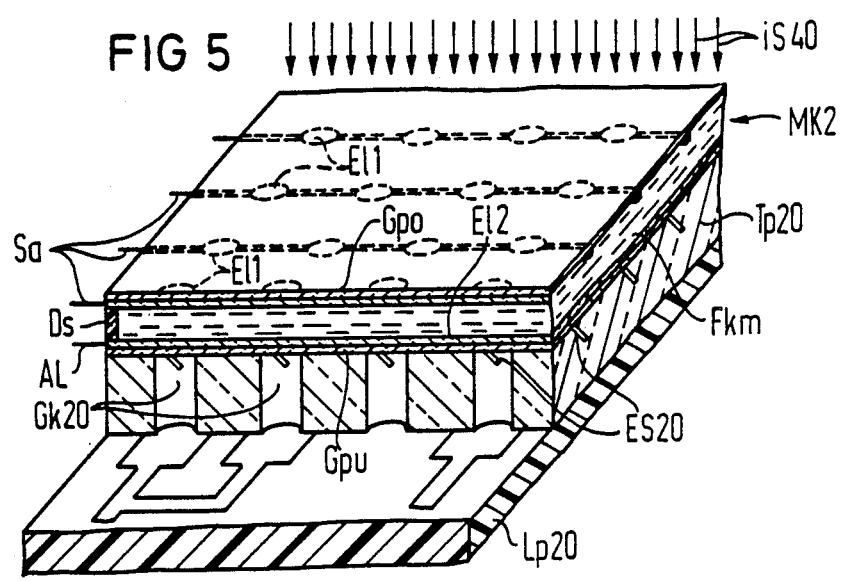
FIG. 5 is a perspective view of another embodiment of the carrier plate shown in FIG. 3 in combination with an ionizing radiation controlling mask.

With reference to FIG. 5, a second possibility for controllably charging the gas discharge channels with an ionizing radiation is shown. A planar ionizing radiation iS40 in the form of UV radiation is directed in parallel fashion over the selected gas discharge channels Gk20 by a parabolic mirror. A controllable mask Mk2 is provided. The mask is placed over an upper side of the carrier plate Tp20 and is formed by a liquid crystal cell which is constructed in the manner of a liquid crystal display. The thin cell includes two planar parallel glass plates Gpo and Gpu which are spaced by spacers Ds and between which a liquid crystal mixture Fkm is maintained. The underside of the upper glass plate Gpo is vapor deposited with a light transmissive grid to form transparent electrodes E11. The transparent electrodes E11 correspond to the gas discharge channels Gk20 and include bus bars Sa connecting the electrodes E11 to one another in rows. The underside of the lower glass plate Gpu is vapor deposited with an electrode E12 over its entire surface. The transparent electrode E12 has an external line A1 provided therefor.

When a voltage is applied to one of the bus bars Sa and to the connecting line A1, the transparency of the liquid crystal mixture Fkm is changed in the electrical field. The liquid crystal mixture Fkm becomes cloudy and impermeable to the ionizing radiation iS40 in the region below the transparent electrodes ES11 of the horizontal row connected to the bus bar Sa.

As set forth above, all bus bars Sa can be connected so that no ionizing radiation iS40 proceeds into the gas discharge channel Gk20. When the connection of a bus bar Sa20 is designationally disconnected, the corresponding horizontal row of gas discharge channels Gk20 are provided with charging ionizing radiation iS40. Since the bus bar Sa and the electrode bus bars ES20 proceed obliquely relative to one another at an angle of 45°, a matrix addressing of the selected measuring locations and the corresponding selected gas discharge channels Gk20 is possible. When the two suspected measuring locations and their corresponding gas discharge channels Gk20 lie in the same horizontal row, then a single bus bar Sa is disconnected while two corresponding bus bars Sa are disconnected in all other cases having two measuring locations.

For the preferred embodiments as set forth in conjunction with FIGS. 3 through 5, the grid dimensions of the measuring locations and, thus, of the gas discharge channels Gk20 is 1/40$^{th}$ of an inch, or about 0.6 mm. The diameter of the gas discharge channels Gk20 is preferably about 0.3 mm and the spacing d between the electrodes E20 and the selected measuring locations which roughly corresponds to the thickness of the carrier plate Tp20 is about 0.5 mm. The entire arrangement is situated in a nitrogen atmosphere under a reduced pressure of about 10 Torr. The minimum normal ignition voltage in such nitrogen atmosphere of p.d=5 Torr mm is about 350 volts. When a voltage of about 650 volts is applied to the electrode bus bars, then ignition of the gas discharges can only be triggered by a reduction of the double ignition voltage by the presence of an ionizing radiation. Fundamentally, the applied radiation must lie between twice the maintaining voltage and twice the value of the normal ignition voltage.

Although modifications and changes may be suggested by those skilled in the art, it is the intention of the inventor to embody within the patent warranted hereon all changes and modifications as reasonably and properly come within the scope of his contribution to the art.

I claim as my invention:

1. An apparatus for electrical function checking of wiring matrices having measuring locations, comprising:
    a carrier plate for placement on a wiring matrix to be tested;
    a plurality of gas discharge channels provided in said carrier plate;
    electrodes disposed in said gas discharge channels;
    electrode bus bars connected to said electrodes for selecting ones of said electrodes; and
    means for controllably charging said gas discharge channels with a radiation, the measuring locations of said wiring matrix to be tested being contactable through selected ones of said gas discharge channels and said electrodes by the controllable charging with radiation to initiate gas discharges.

2. An apparatus as claimed in claim 1, wherein said electrodes of said gas discharge channels are connected to one another in rows by said electrode bus bars.

3. An apparatus as claimed in claim 1, wherein said electrode bus bars extend obliquely relative to the principal directions of the wiring of the wiring matrix to be tested.

4. An apparatus as claimed in claim 1, wherein said electrodes are formed by portions of said electrode bus bars in the regions crossing said gas discharge channels.

5. An apparatus as claimed in claim 1, wherein said means for controllably charging includes for means for controllably deflecting rays of radiation onto said gas discharge channels to selectively charge said gas discharge channels to initiate gas discharges.

6. An apparatus as claimed in claim 1, further comprising:
a mask having radiation transmissive regions corresponding to said gas discharge channels for controllably charging said gas discharge channels with a radiation.

7. An apparatus as claimed in claim 6, wherein said mask includes a liquid crystal cell having transparent electrodes corresponding to said gas discharge channels.

8. An apparatus as claimed in claim 7, further comprising: bus bars for driving said transparent electrodes.

9. An apparatus as claimed in claim 8, wherein said bus bars for driving connect said transparent electrodes to one another in rows.

10. An apparatus as claimed in claim 9, wherein said bus bars for driving proceed obliquely relative to said electrode bus bars.

* * * * *